(12) United States Patent
Park et al.

(10) Patent No.: US 8,399,271 B2
(45) Date of Patent: Mar. 19, 2013

(54) DISPLAY APPARATUS WITH STORAGE ELECTRODES HAVING CONCAVO-CONVEX FEATURES

(75) Inventors: Dae-Jin Park, Incheon (KR); Kyu-Young Kim, Suwon-Si (KR); Hyung Il Jeon, Suwon-Si (KR); Ju-Han Bae, Suwon-Si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/181,372

(22) Filed: Jul. 12, 2011

(65) Prior Publication Data

US 2011/0266956 A1    Nov. 3, 2011

Related U.S. Application Data

(62) Division of application No. 12/143,996, filed on Jun. 23, 2008, now Pat. No. 7,989,813.

(30) Foreign Application Priority Data

Jan. 2, 2008    (KR) .................. 10-2008-0000211

(51) Int. Cl.
*H01L 21/00* (2006.01)
*H01L 21/283* (2006.01)

(52) U.S. Cl. ....... 438/29; 439/30; 439/164; 257/E31.12; 349/143

(58) Field of Classification Search ............ 438/29, 438/30, 164; 257/E31.13; 349/38, 143, 147
See application file for complete search history.

(56) References Cited

U.S. PATENT DOCUMENTS

| | | | | |
|---|---|---|---|---|
| 4,431,272 A | * | 2/1984 | Yazawa et al. | 349/113 |
| 6,097,458 A | * | 8/2000 | Tsuda et al. | 349/113 |
| 6,384,886 B2 | * | 5/2002 | Yamazaki et al. | 349/113 |
| 6,426,787 B1 | * | 7/2002 | Satake et al. | 349/138 |
| 6,469,759 B2 | * | 10/2002 | Jang et al. | 349/113 |
| 6,825,891 B2 | | 11/2004 | Kurashina | |
| 6,963,381 B2 | * | 11/2005 | Kano et al. | 349/113 |
| 7,456,912 B2 | * | 11/2008 | Wong et al. | 349/43 |
| 2002/0140877 A1 | * | 10/2002 | Chen | 349/38 |
| 2007/0153142 A1 | | 7/2007 | Nam et al. | |
| 2007/0159563 A1 | | 7/2007 | Moriwaki | |
| 2007/0161184 A1 | | 7/2007 | Kim et al. | |

FOREIGN PATENT DOCUMENTS

| | | |
|---|---|---|
| JP | 2005-148217 | 6/2005 |
| KR | 1020060109638 A | 10/2006 |
| KR | 1020070054516 A | 5/2007 |

* cited by examiner

*Primary Examiner* — Jerome Jackson, Jr.
*Assistant Examiner* — Paul Budd
(74) *Attorney, Agent, or Firm* — Innovation Counsel LLP

(57) ABSTRACT

A display apparatus includes a substrate; a first insulating layer formed on the substrate and having an upper surface including a concavo-convex area including one or more concave features and one or more convex features; a first storage electrode overlaying the upper surface and a side surface of the first insulating layer and having an upper surface including a concavo-convex area including one or more concave features and one or more convex features, each concave feature of the first storage electrode overlying at least one respective concave feature of the first insulating layer, each convex feature of the first storage electrode overlying at least one respective convex feature of the first insulating layer; a second insulating layer formed on the first storage electrode; and a second storage electrode formed on the second insulating layer which separates the second storage electrode from the underlying first storage electrode.

5 Claims, 4 Drawing Sheets

DISPLAY APPARATUS WITH STORAGE ELECTRODES HAVING CONCAVO-CONVEX FEATURES

CROSS-REFERENCE TO RELATED APPLICATION

This application is a divisional application of U.S. patent application Ser. No. 12/143,996 filed on Jun. 23, 2008, where the latter relies for priority upon South Korean Patent Application No. 10-2008-0000211 filed on Jan. 2, 2008, where the contents of both said applications are herein incorporated by reference in their entirety.

BACKGROUND

1. Field of the Invention

The present invention relates to a display apparatus, and more particularly to a storage capacitor in the display apparatus.

2. Description of the Related Art

In a liquid crystal display, a pixel may include a storage capacitor to help maintain the pixel voltage for a duration of a frame. The storage capacitor is formed by an electrode ("first storage electrode") fabricated from the same layers as gate lines and gate electrodes and overlapping the pixel electrode. Thus, the first storage electrode is formed from a light blocking metallic material, and its overlap with the pixel electrode decreases the pixel's aperture ratio.

In order to reduce the storage capacitor's size but not the capacitance, various methods have been researched, such as reducing the distance between storage capacitor's electrodes, using concavo-convex surfaces to increase the surface area of the storage capacitor's electrodes, using an insulating layer having a high dielectric constant between the storage electrodes, etc.

However, these methods require extensive photolithographic processing.

SUMMARY

This section describes some features of some embodiments of the present invention. Other features are described in subsequent sections. The invention is defined by the appended claims, which are incorporated into this section by reference.

Some embodiments of the present invention provide a display apparatus that can be manufactured using simplified processes and has an efficient storage capacitor.

Some embodiments also provide methods of manufacturing the display apparatus.

Some embodiments provide a display apparatus comprising: a substrate; a first insulating feature formed on the substrate and having an upper surface comprising a concavo-convex area comprising one or more concave features and one or more convex features; a first storage electrode overlaying the upper surface and a side surface of the first insulating feature and having an upper surface comprising a concavo-convex area comprising one or more concave features and one or more convex features, each concave feature of the first storage electrode overlaying at least one respective concave feature of the first insulating feature, each convex feature of the first storage electrode overlaying at least one respective convex feature of the first insulating feature; a second insulating feature formed on the first storage electrode; and a second storage electrode formed on the second insulating feature which separates the second storage electrode from the underlying first storage electrode.

In some embodiments, the second storage electrode comprises a bottom surface comprising a concavo-convex area comprising one or more concave features and one or more convex features, each concave feature of the second storage electrode overlying at least one respective convex feature of the first storage electrode, each convex feature of the second storage electrode overlying at least one respective concave feature of the first storage electrode.

Some embodiments provide a display apparatus comprising: a substrate; a first insulating feature formed on the substrate and having an upper surface comprising a concavo-convex area comprising one or more concave features and one or more convex features; a gate electrode formed on the substrate; a first storage electrode including the same material as the gate electrode, the first storage electrode overlaying an upper surface and a side surface of the first insulating layer feature; a second insulating feature formed on the gate electrode and the first storage electrode; a semiconductor feature formed on the second insulating feature over the gate electrode; a source electrode formed on the semiconductor feature; a drain electrode formed on the semiconductor feature; and a third insulating feature formed on the source electrode, the drain electrode, and the semiconductor feature.

Some embodiments include a pixel electrode formed on the third insulating feature and electrically connected to the drain electrode, wherein the pixel electrode comprises a concavo-convex area overlaying the first storage electrode.

In some embodiments, the drain electrode extends to a region overlying the first storage electrode.

In some embodiments, the drain electrode comprises a bottom surface comprising a concavo-convex area in the region overlying the first storage electrode, the concavo-convex area of the drain electrode comprising one or more concave features and one or more convex features, each concave feature of the drain electrode overlaying at least one respective convex feature of the first insulating feature, each convex feature of the drain electrode overlaying at least one respective concave feature of the first insulating feature.

Some embodiments provide a method of manufacturing a display apparatus, the method comprising: forming a first insulating layer on a substrate; patterning the first insulating layer to form a concavo-convex insulating feature and a sacrificial insulating feature thicker than the concavo-convex insulating feature; forming a metal layer over an upper surface and a side surface of the concavo-convex insulating feature and on the sacrificial insulating feature; removing the sacrificial insulating feature, wherein the metal layer over the upper and side surfaces of concavo-convex insulating feature provides a first storage electrode overlaying the upper and side surfaces of the concavo-convex insulating feature, the first storage electrode comprising a concavo-convex area; forming a second insulating layer on the first storage electrode; and forming a second storage electrode on the second insulating layer over the first storage electrode.

In some embodiments, forming the concavo-convex insulating feature and the sacrificial insulating feature comprises: pressing, onto the first insulating layer, a die comprising patterns corresponding to the concavo-convex insulating feature and the sacrificial insulating feature; and reducing a thickness of the first insulating layer after removing the die.

In some embodiments, the second storage electrode comprises a bottom surface comprising a concavo-convex area comprising one or more concave features and one or more convex features, each concave feature of the second storage electrode overlying at least one respective convex feature of the concavo-convex insulating feature, each convex feature of the second storage electrode overlying at least one respective concave feature of the concavo-convex insulating feature.

Some embodiments provide a method of manufacturing a display apparatus, the method comprising: forming a first insulating layer on a substrate; patterning the first insulating layer to form an opening that exposes the substrate and also to form a concavo-convex insulating feature and a sacrificial insulating feature thicker than the concavo-convex insulating feature; forming a metal layer on the substrate's portion exposed by the opening, over an upper surface and a side surface of the concavo-convex insulating feature, and on an upper surface of the sacrificial insulating feature; removing the sacrificial insulating feature to form a first storage electrode that covers the upper and side surfaces of the concavo-convex insulating feature and has a concavo-convex area and to form a gate electrode on the substrate's portion exposed by the opening; forming a second insulating layer on the gate electrode and the first storage electrode; forming a semiconductor feature on the second insulating layer over the gate electrode; forming a source/drain electrode on the semiconductor pattern; and forming a third insulating layer on the source/drain electrode and the semiconductor feature.

Some embodiments comprise forming a pixel electrode on the third insulating layer to allow the pixel electrode to be electrically connected to the drain electrode, wherein the pixel electrode comprises a concavo-convex area in a region overlying the first storage electrode.

In some embodiments, the drain electrode comprises an extension extending to the region overlying the first storage electrode.

In some embodiments, the drain electrode's extension comprises a bottom surface comprising a concavo-convex area in the region overlying the first storage electrode, the concavo-convex area of the drain electrode comprising one or more concave features and one or more convex features, each concave feature of the drain electrode overlying at least one respective convex feature of the concavo-convex insulating feature, each convex feature of the drain electrode overlying at least one respective concave feature of the concavo-convex insulating feature.

In some embodiments, forming the opening, the concavo-convex insulating feature and the sacrificial insulating feature comprises: pressing, onto the first insulating layer, a die comprising patterns corresponding to the opening, the concavo-convex insulating feature, and the sacrificial insulating feature; and reducing a thickness of the first insulating layer after removing the die.

In some embodiments, the sacrificial insulating features, the gate electrodes, and the storage electrodes are formed by a pressure process, so the gate and storage electrodes may be defined without photolithography. The manufacturing process may therefore be simplified.

DESCRIPTION OF THE EMBODIMENTS

Figure 1:
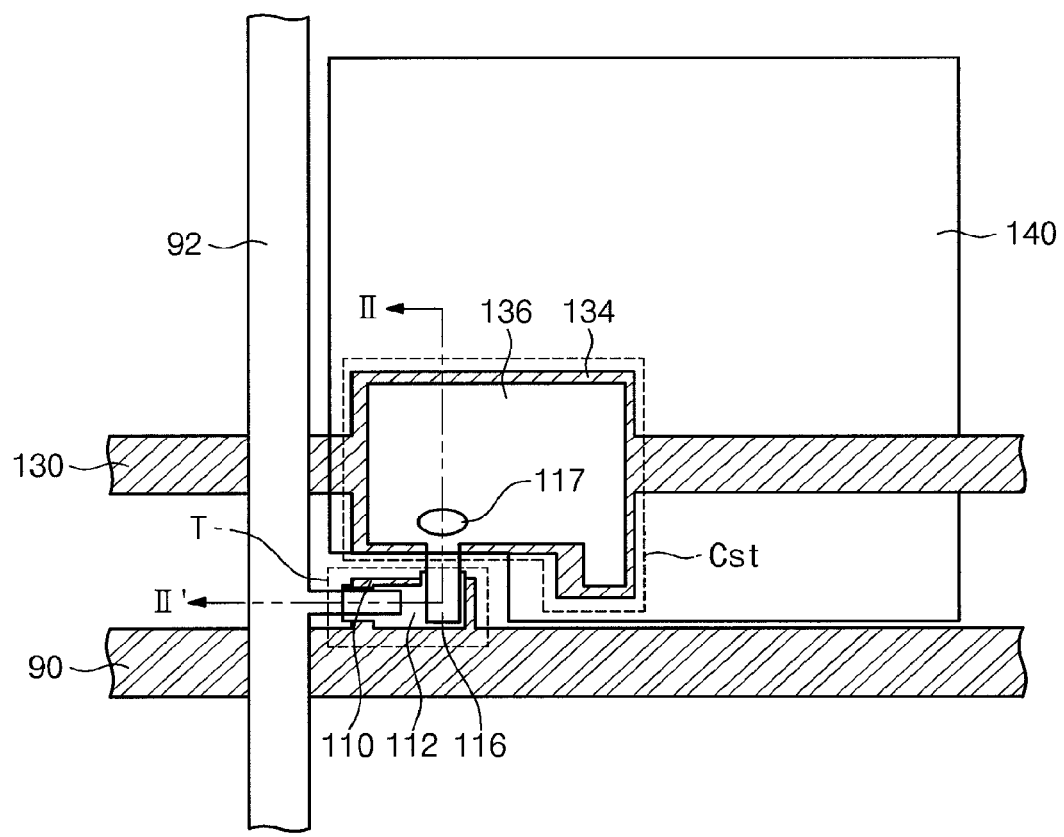
FIG. 1 is a plan view showing an array substrate for a display apparatus according to an exemplary embodiment of the present invention.

It will be understood that when an element or layer is referred to as being "on", "connected to" or "coupled to" another element or layer, then intervening elements or layers may or may not be present. In contrast, when an element is referred to as being "directly on," "directly connected to" or "directly coupled to" another element or layer, then there are no intervening elements or layers. Like reference numerals refer to like elements throughout. As used herein, the term "and/or" includes any and all combinations of one or more of the associated listed items.

Terms like "first", "second", etc. may be used herein to distinguish one element from another. Such terms are mere reference labels that are interchangeable and do not limit the invention.

Spatially relative terms, such as "beneath", "below", "lower", "above", "upper" and the like, may be used herein for ease of description, especially with reference to the figures. The spatially relative terms are not intended to limit orientations of the device in use or operation. For example, the device can be turned upside down relative to the illustrations in the figures and/or may be rotated or oriented in some other way.

Some embodiments of the present invention will now be described in detail with reference to the accompanying drawings.

Figure 2:
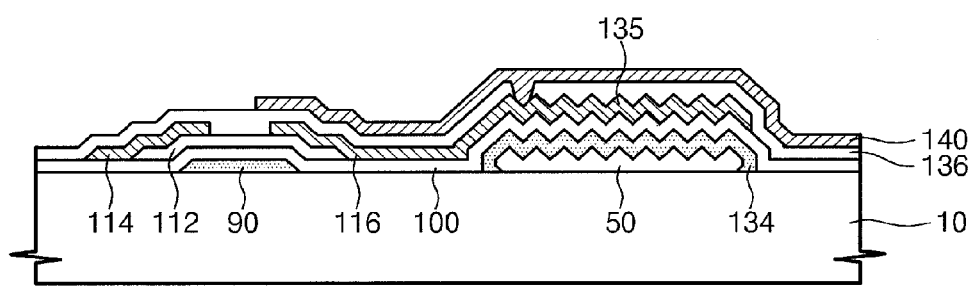
FIG. 2 shows a vertical cross-section taken along a line II-II' of FIG. 1.

FIG. 1 is a plan view showing an array substrate for a display apparatus according to an exemplary embodiment of the present invention, and FIG. 2 is a cross-sectional view taken along the line II-II' of FIG. 1. The array substrate includes a first substrate 10, gate lines 90 formed on the first substrate 10, data lines 92 formed on the first substrate 10 and crossing over or under the gate lines 90, thin film transistors T each of which is electrically connected to a gate line 90 and a data line 92, and pixel electrodes 140 each of which is electrically connected to a thin film transistor T. The array substrate also includes storage lines 130 each of which is overlapped with respective pixel electrodes 140 when viewed in plan view. Each thin film transistor T has an electrode extended to overlap with a first storage electrode 134 integrally formed with the storage line 130. This overlap serves to form a storage capacitor Cst. Alternatively, the storage capacitor Cst may be formed by an overlap between the first storage electrode 134 and the pixel electrode 140 (which is connected to an electrode of the thin film transistor T).

Although not shown in FIG. 1, the display apparatus may further include a second substrate facing the first substrate 10, with a liquid crystal layer interposed between the first substrate 10 and the second substrate. The second substrate may include a black matrix formed in regions opposite to the gate and data lines 90 and 92, and may include a common electrode opposite to the pixel electrodes 140. Also, the second substrate may further include color filters formed opposite to the pixel electrodes 140. Alternatively, the color filters may be formed on the first substrate 10, for example under the pixel electrodes 140.

The display apparatus induces an electric field in the liquid crystal layer between each pixel electrode 140 and the common electrode, so the display apparatus may change the polarizing characteristics of the liquid crystal layer with respect to incident light. More particularly, due to polarizers (not shown) attached to the outer surfaces of the first and second substrates, the light entering the liquid crystal layer has a specific polarizing axis. By controlling the electric field in the liquid crystal layer, the display apparatus controls the polarizing characteristics of the liquid crystal layer and hence the intensity of light exiting the apparatus through the liquid crystal layer and the polarizer attached to the outer surface of the second substrate on which the common electrode is formed. A desired image can thus be displayed. Since more light passes through the pixel electrode 140 if the storage electrode is smaller, the display efficiency of the display apparatus may be improved.

In each pixel, the pixel electrode 140 and an electrode of the thin film transistor T are electrically connected to each other through a contact hole 117 formed through layers between the pixel electrode 140 and the electrode of the thin film transistor T. These layers may include a protective insulating layer 136. The protective insulating layer 136 may make contact with channel regions in a semiconductor layer 112.

The pixel electrode 140 may include a transparent conductive material such as indium thin oxide (ITO) or indium zinc oxide (IZO). The gate lines 90, the data lines 92, and the storage lines 130 may be single-layer or multi-layer structures including various materials such as chromium, aluminum, molybdenum, titanium, copper, silver, and/or their alloys.

Referring to FIG. 2, an insulating layer 50 having an upper surface with concavo-convex areas is formed on the first substrate 10, and the first storage electrodes 134 are formed on the insulating layer 50. The first storage electrodes 134 include the same material as the gate electrodes 90 and may be formed from the same layer or layers as the gate electrodes 90. Each first storage electrode 134 overlays upper and side surfaces of the insulating layer 50 and adjacent portions of the first substrate 10. Each first storage electrode 134 may or may not be a conformal layer. Each first storage electrode 134 has a concavo-convex topography (with peaks and valleys) following the topography of the top surface of the insulating layer 50. Each peak area of the first storage electrode 134 overlies a peak (a convex feature) of the insulating layer 50, and each valley of the first storage electrode 134 overlies a valley (a concave feature) of the insulating layer 50.

In the present exemplary embodiment, the insulating layer 50 may be an organic insulating layer.

A gate insulating layer 100 is formed over the first substrate 10 after the gate electrodes 90 and the first storage electrodes 134. The gate insulating layer 100 may or may not be a conformal layer. The gate insulating layer 100 has a concavo-convex topography (with peaks and valleys) following the topography of the first storage electrode 134. Each peak area of the gate insulating layer 100 overlies a peak of the first storage electrode 134, and each valley of the gate insulating layer 100 overlies a valley of the first storage electrode 134.

The semiconductor features 112 are formed on the gate insulating layer 100. The gate insulating layer 100 may be an inorganic insulating layer such as silicon nitride, silicon oxide, or the like. In order not to provide additional obstruction to light incident from under the first substrate 10, the semiconductor features 112 can be made narrower than the gate electrodes 90 such that the semiconductor features 112 are located inside the gate electrodes 90 in plan view. Alternatively, the semiconductor features 112 may extend outside the gate electrodes 90 along source electrodes 114 and drain electrodes 116.

The source and drain electrodes 114 and 116 are formed on the semiconductor features 112 and the gate insulating layer 100. In each pixel, the source and drain electrodes 114 and 116 are spaced from each other, with the channel region of the thin film transistor T located therebetween and above the gate electrode 90. The drain electrode 116 has an extension which provides a second storage electrode 135 of the storage capacitor Cst. The second storage electrode 135 overlies the first storage electrode 134 and is separated therefrom by the gate insulating layer 100. The second storage electrode 135 may have concavo-convex topography above the first storage electrode 134 and the gate insulating layer 100. The second storage electrode 135 may or may not be a conformal layer. Each peak area of the second storage electrode 135 overlies a peak of the gate insulating layer 100, and each valley of the second storage electrode 135 overlies a valley of the gate insulating layer 100.

In particular, the bottom surface of the second storage electrode 135 may have a concavo-convex area above the first storage electrode 134. The concavo-convex bottom area of the bottom surface of the second storage electrode 135 may have a plurality of concave and convex features, with each concave feature (an upward protrusion) overlying a convex feature (also an upward protrusion) of the upper surface of the first storage electrode 134, and each convex feature (a downward protrusion) of the bottom surface of the second storage electrode 135 overlying a concave feature (also a downward protrusion) of the upper surface of the first storage electrode 134. Also, the concavo-convex top surface of the second storage electrode 135 may serve as a reflector that reflects the external light.

In an alternative embodiment (FIG. 7), the source and drain electrodes 114 and 116 are laterally restricted not to overlie the first storage electrode 134, and the second storage electrode 135 of the storage capacitor Cst is provided by the pixel electrode 140.

The protective insulating layer 136 is formed over the source electrodes 114, the drain electrodes 116, the semiconductor features 112, and the gate insulating layer 100. The protective insulating layer 136 may include the same material as the gate insulating layer 100, or may have a double-layered structure including an inorganic insulating layer and an organic insulating layer. If the protective insulating layer 136 includes an organic insulating layer, the pixel electrode 140 of each pixel may be overlapped with the respective gate line 90 and/or data line 92.

The pixel electrodes 140 are formed over the protective insulating layer 136. In each pixel, the pixel electrode 140 contacts the second storage electrode 135 (formed as an extension of the drain electrode 116) through the contact hole 117. The second storage electrode 135 thus serves to electrically connect the pixel electrode 140 with the drain electrode 116. The contact hole 117 may be formed above the first storage electrode 134.

As described above, the concavo-convex area on the upper surface of the first storage electrode 134 serves to increase the areas of the first and second storage electrodes 134 and 135 of the storage capacitor Cst. As a result, the lateral extent of the storage capacitor Cst may be reduced without reducing the capacitor's capacitance, and also the second storage electrode 135 may serve as a reflector.

FIGS. 3 to 6 illustrate a method of manufacturing an array substrate for a display apparatus according to some embodiments of the present invention.

Figure 3:
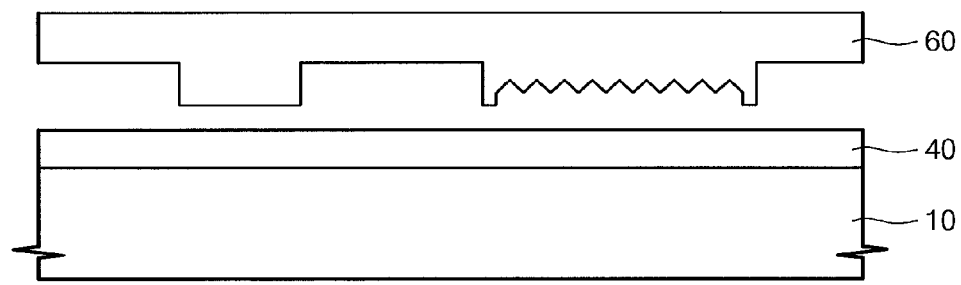
FIGS. 3 to 6 show vertical cross sections illustrating an array substrate for a display apparatus at different stages of fabrication according to some embodiments of the present invention.

Referring to FIG. 3, a first insulating layer 40 is formed on the first substrate 10. The first insulating layer 40 is made of an organic insulating material curable by heat or light. Suitable materials include light-cured polymers, heat-cured polymers, and others.

A die 60 is arranged to face the first insulating layer 40. The die 60 includes various patterns that will be formed in the insulating layer 40. More particularly, the die 60 includes patterns corresponding to concavo-convex insulating features 50 (also shown at P3 in FIG. 4), sacrificial insulating features P2, and to openings P1 that will expose the substrate 10.

The die 60 may include a material having a lower hardness than cured insulating layer 40.

The concavo-convex insulating features 50, the sacrificial insulating features, and the openings are formed through a pressure process. More particularly, the die 60 is pressed onto the first insulating layer 40 to form first insulating layer features 42, and the first insulating layer 40 is cured by ultraviolet light or heat. Then the die 60 is separated from the first insulating layer 40, and an ashing process is performed with respect to the first insulating layer features 42 to reduce their thickness and provide undercut at their boundary. With the undercut, the first insulating layer features 42 have a retrograde slope at the boundary thereof as shown in FIG. 4.

If the hardness of the die 60 is lower than the hardness of the cured first insulating layer features 42, the retrograde slope of the first insulating features 42 can be provided by providing a corresponding slope to the features of the die 60. The lower hardness of the die 60 will protect the first insulating layer 42 from damage even if the die 60 is separated from the first insulating layer 42 when the first insulating layer 42 has been cured.

Figure 4:
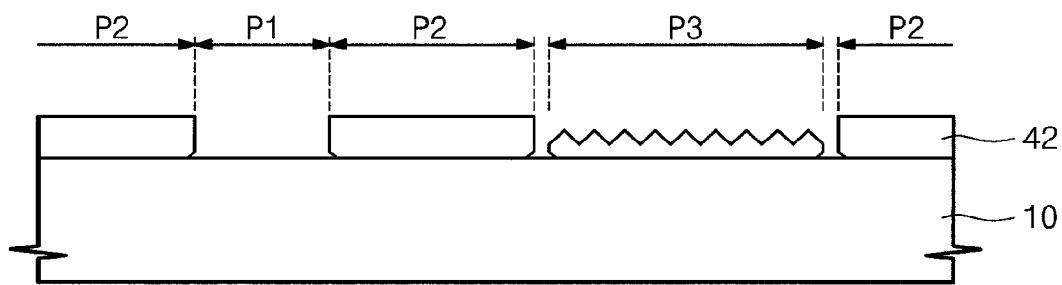

FIG. 4 shows the first insulating layer features 42 after ashing. The first insulating features 42 include the openings P1 exposing the substrate 10 and also include the concavo-convex insulating features P3 and the sacrificial insulating features P2. The openings P1 are defined by the sacrificial insulating features P2. The sacrificial insulating features P2 are thicker than the concavo-convex insulating features P3.

Figure 5:
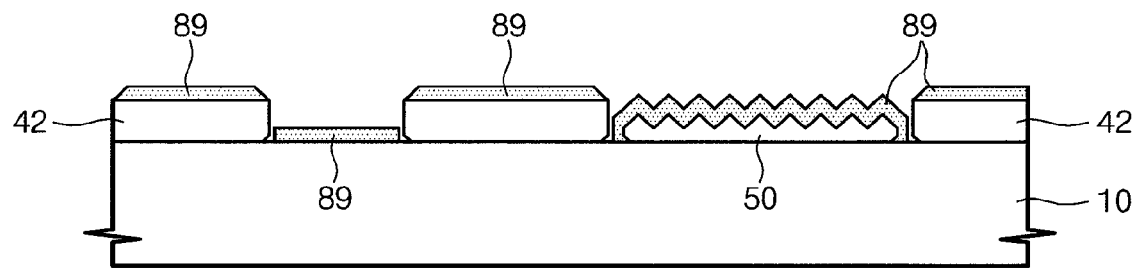

Referring to FIG. 5, a wiring layer 89 is formed directly on the portions of the first substrate 10 that are exposed by the openings P1 and also on the sacrificial insulating features P2 and the concavo-convex insulating features P3. The wiring layer 89 is metal and may include one or more layers of various materials such as chromium, aluminum, molybdenum, titanium, copper, silver, alloys of chromium, aluminum, molybdenum, titanium, copper, and/or their alloys. Since the concavo-convex insulating features P3 are relatively thin, the wiring layer 89 may be formed both on top and on the sidewalls of the concavo-convex insulating features P3 and may also be present on the adjacent portions of the first substrate 10. However, the sacrificial insulating features P2 have the wiring layer 89 formed mainly on their upper surface because the sacrificial insulating features P2 are thicker than the concavo-convex insulating features P3 and have the retrograde slope shape at the boundary thereof. As a result, the portions of the wiring layer 89 on top of the sacrificial insulating features P2 are spaced from the portions of the wiring layer 89 formed on the concavo-convex insulating features P3 and directly on the first substrate 10.

In the present exemplary embodiment, the portions of the wiring layer 89 on the concavo-convex insulating features P3 have the concavo-convex top and bottom surfaces corresponding to the concavo-convex insulating features P3. In particular, the wiring layer 89 may or may not be a conformal layer. On the concavo-convex insulating features 50, the wiring layer 89 has a concavo-convex topography (with peaks and valleys) following the topography of the top surface of the concavo-convex insulating features 50. Each peak area of the wiring layer 89 overlies a peak (a convex feature) of the concavo-convex insulating feature 50, and each valley of the wiring layer 89 overlies a valley (a concave feature) of a concavo-convex 50.

In particular, each of the top and bottom surfaces of the wiring layer 89 may have a concavo-convex area above the concavo-convex insulating feature P3. Each concave feature of the top surface of the wiring layer 89 may overlie a convex feature of the bottom surface of the wiring layer 89 and a concave feature of the top surface of the insulating feature P3. Each convex feature of the top surface of the wiring layer 89 may overlie a concave feature of the bottom surface of the wiring layer 89 and a convex feature of the top surface of the insulating feature P3.

Figure 6:
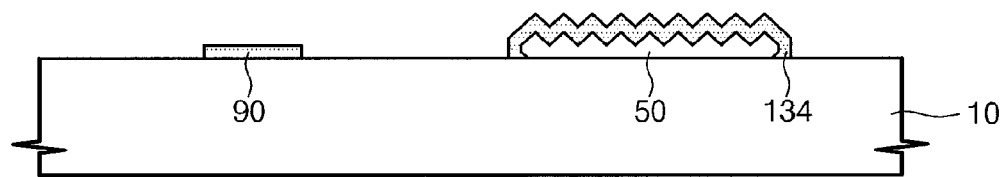

Referring to FIG. 6, the sacrificial insulating features P2 are stripped by an etch that attacks their exposed sidewalls. The overlying portions of the wiring layer 89 become removed in this process. The portions of the wiring layer 89 directly on the first substrate 10 and on the concavo-convex insulating features P3 remain in the structure and form respectively the gate lines 90 and the first storage electrodes 134.

As seen from the description above, the gate lines 90 and the first storage electrodes 134 are formed without photolithography. The first storage electrodes 134 inherit the concavo-convex topography from the underlying first insulating layer 42. In particular, in each first storage electrode 134, each concave feature overlies a respective concave feature of the first insulating layer 42, and each convex feature of the first storage electrode 134 overlies a respective convex feature of the first insulating layer 42.

Referring again to FIG. 2, the gate insulating layer 100, the semiconductor features 112, the source and drain electrodes 114 and 116, the protective insulating layer 136, and the pixel electrodes 140 are sequentially formed on the first substrate 10 after the gate lines 90 and the first storage electrodes 50, thereby completing fabrication of the array substrate of the display apparatus.

Figure 7:
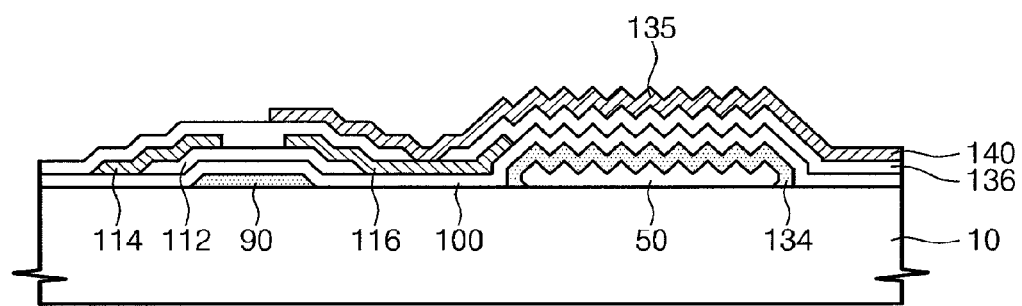
FIG. 7 shows a vertical cross-section showing an array substrate for a display apparatus according to another exemplary embodiment of the present invention.

FIG. 7 is a cross sectional view showing an array substrate for a display apparatus according to another exemplary embodiment of the present invention. In FIG. 7, the same reference numerals denote the same elements in FIG. 2, and detailed description of such elements will be omitted.

In each pixel of FIG. 7, the drain electrode 116 is not extended to overlie the first storage electrode 134. The pixel electrode 140 is electrically connected to the drain electrode 116 through a contact hole formed through the protective insulating layer 136, but the contact hole does not overlie the first storage electrode 134. The storage capacitor Cst can be provided by the pixel electrode 140 overlapping with the first storage electrode 134, together with the intervening gate insulating layer 100 and protective insulating layer 136 between the first storage electrode 134. The pixel electrode 140 may thus provide the second storage electrode 135 of the storage capacitor Cst.

Above the first storage electrode 134, the protective insulating layer 136 may have concavo-convex topography following the topography of the first storage electrode 134 and the gate insulating layer 100. The protective insulating layer 136 may or may not be a conformal layer. Each peak area of the protective insulating layer 136 overlies a peak of the gate insulating layer 100 and a peak of the first storage electrode 134, and each valley of the protective insulating layer 136 overlies a valley of the gate insulating layer 100 and a valley of the first storage electrode 134.

Above the first storage electrode 134, the second storage electrode 135 may have concavo-convex topography following the topography of the first storage electrode 134, the gate insulating layer 100, and the protective insulating layer 136. The second storage electrode 135 may or may not be a conformal layer. Each peak area of the second storage electrode 135 overlies a peak of the protective insulating layer 136, and each valley of the second storage electrode 135 overlies a valley of the protective insulating layer 136.

The bottom surface of the second storage electrode 135 may have a concavo-convex area above the first storage electrode 134. The concavo-convex bottom area of the bottom surface of the second storage electrode 135 may have a plurality of concave and convex features, with each concave feature overlying a convex feature of the upper surface of the first storage electrode 134, and each convex feature of the bottom surface of the second storage electrode 135 overlying a concave feature of the upper surface of the first storage electrode 134. Also, the concavo-convex top surface of the second storage electrode 135 may serve as a reflector that reflects the external light.

As seen from the above, formation on the substrate of the insulating feature with the concavo-convex surface allows formation of the storage electrode with the concavo-convex surface on the insulating feature simultaneously with the gate lines and the gate electrodes. Also, the sacrificial insulating features, the gate electrodes, and the storage electrodes are formed through the pressure process, and therefore the gate and storage electrodes can be patterned without photolithography. Thus, the manufacturing process can be simplified.

The present teachings are not intended to be limited to the exemplary embodiments described above, but instead are to be understood as including other embodiments and variations within the spirit and scope of the present teachings.

What is claimed is:

1. A method of manufacturing a display apparatus, the method comprising:
   forming a first insulating layer on top of a substrate;
   patterning the first insulating layer to form an opening that exposes the substrate and also to form a concavo-convex insulating layer and a sacrificial insulating layer thicker than the concavo-convex insulating layer, wherein the concavo-convex insulating layer has an upper surface comprising a concavo-convex area and has one or more side surfaces adjacent to the upper surface;
   forming a metal layer on the substrate's portion exposed by the opening, over the upper surface and the one or more side surfaces of the concavo-convex insulating layer, and on an upper surface of the sacrificial insulating layer;
   removing the sacrificial insulating layer to form a first storage electrode that covers the concavo-convex area of the upper and at least one of the one or more side surfaces of the concavo-convex insulating layer and to form a gate electrode on the substrate's portion exposed by the opening;
   forming a second insulating layer on top of the gate electrode and on top of the first storage electrode;
   forming a semiconductor layer on top of the second insulating layer and over the gate electrode;
   forming a source/drain electrode on the semiconductor pattern; and
   forming a third insulating layer on top of the source/drain electrode and the semiconductor layer.

2. The method of claim 1, further comprising forming a pixel electrode on the third insulating layer to allow the pixel electrode to be electrically connected to the drain electrode, wherein the pixel electrode comprises a concavo-convex area in a region overlying the first storage electrode.

3. The method of claim 2, wherein the drain electrode comprises an extension extending to the region overlying the first storage electrode.

4. The method of claim 3, wherein the drain electrode's extension comprises a bottom surface comprising a concavo-convex area in the region overlying the first storage electrode, the concavo-convex area of the drain electrode comprising one or more concave features and one or more convex features, each concave feature of the drain electrode overlying at least one respective convex feature of the concavo-convex insulating layer, each convex feature of the drain electrode overlying at least one respective concave feature of the concavo-convex insulating layer.

5. The method of claim 2, wherein forming the opening, the concavo-convex insulating layer and the sacrificial insulating layer comprises:
   pressing, onto the first insulating layer, a mold comprising patterns corresponding to the opening, the concavo-convex insulating layer, and the sacrificial insulating layer; and
   reducing a thickness of the first insulating layer after removing the mold.

* * * * *